(12) United States Patent
Borade et al.

(10) Patent No.: US 8,384,035 B2
(45) Date of Patent: Feb. 26, 2013

(54) LANTHANIDE DOPED BARIUM PHOSPHOROUS OXIDE SCINTILLATORS

(75) Inventors: Ramesh B. Borade, Livermore, CA (US); Edith Bourret-Courchesne, Berkeley, CA (US); Stephen E. Derenzo, Pinole, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/911,583

(22) Filed: Oct. 25, 2010

(65) Prior Publication Data

US 2011/0168901 A1 Jul. 14, 2011

Related U.S. Application Data

(60) Provisional application No. 61/254,612, filed on Oct. 23, 2009.

(51) Int. Cl.
*G01T 1/20* (2006.01)

(52) U.S. Cl. .................................................. 250/361 R

(58) Field of Classification Search .............. 250/361 R, 250/301.4 P, 301.4 R
See application file for complete search history.

(56) References Cited

PUBLICATIONS

Bugos et al., Emission Properties of Phosphors for High Bmperature Sensor Applications, 1988, IEEE, pp. 228-233.*
Schipper et al., The X-ray Storage Properties of Barium Phosphate Doped with Trivalent Rare Earth Ions, 1994, Phys Stat. Sol., pp. 231-238.*
Dorenbos, P, Anaomalous Luminescence of Eu2+ and Yb2+ in Inorganic Compounds, 2003, Journal of Physics:Condensed Matter, vol. 15, pp. 2645-2665.*

* cited by examiner

*Primary Examiner* — Christine Sung
(74) *Attorney, Agent, or Firm* — Robin C. Chiang; Lawrence Berkeley National Laboratory

(57) ABSTRACT

The present invention provides for a composition comprising an inorganic scintillator comprising a lanthanide-doped barium phosphorous oxide useful for detecting nuclear material.

19 Claims, 6 Drawing Sheets

LANTHANIDE DOPED BARIUM PHOSPHOROUS OXIDE SCINTILLATORS

CROSS-REFERENCE TO RELATED APPLICATIONS

This application claims priority to U.S. Provisional Patent Application Ser. No. 61/254,612, filed Oct. 23, 2009, which is hereby incorporated by reference.

STATEMENT OF GOVERNMENTAL SUPPORT

The invention was made with government support under Grant No. HSHQDC-07-X-00170 awarded by the U.S. Department of Homeland Security, and Contract No. DE-AC02-05CH11231 awarded by the U.S. Department of Energy. The government has certain rights in the invention.

FIELD OF THE INVENTION

The present invention is in the field of inorganic crystals with scintillation properties useful as gamma-ray detectors.

BACKGROUND OF THE INVENTION

The need for radiation detecting materials has been at the forefront of materials research in recent years due to applications in national security, medical imaging, X-ray detection, oil well logging, and high-energy physics. Essential qualities that a scintillator must possess are high light yields, fast luminescence decay (below 1000 ns), good stopping power, high density, good energy resolution, ease of growth, proportionality, and stability under ambient conditions. $La_xBr_3$:$Ce_{1-x}$ (E. V. D. van Loef et al, Appl. Phys. Lett., 2001, 79, 1573) and $Sr_xI_2$:$Eu_{1-x}$ (N. Cherepy et al, Appl. Phys. Lett. 2007, 92, 083508) are present day benchmark materials that satisfy some of the desired criteria, but their application is limited due to the extreme hygroscopic nature.

SUMMARY OF THE INVENTION

The present invention provides for a composition comprising an inorganic scintillator comprising a lanthanide-doped barium phosphorous oxide useful for detecting nuclear material.

The present invention provides for an inorganic scintillator having the formula:

$$Ba_{3-x}P_yO_z:Ln_x \quad (I);$$

wherein Ln is a lanthanide with a valence of 2+; x has a value having the range 0<x<3; and, y is 2 and z is 8, or y is 4 and z is 13.

In some embodiments of the invention, the inorganic scintillator has the formula:

$$Ba_{3-x}(PO_4)_2:Ln_x \quad (II);$$

wherein Ln is a lanthanide with a valence of 2+, and x has a value having the range 0<x<3.

In some embodiments of the invention, the inorganic scintillator has the formula:

$$Ba_{3-x}P_4O_{13}:Ln_x \quad (III);$$

wherein Ln is a lanthanide with a valence of 2+, and x has a value having the range 0<x<3.

In some embodiments of the invention, the Ln is Eu.

In some embodiments of the invention, the inorganic scintillator is a single crystal having at least one dimension of a length of at least 1 mm, at least 5 mm, at least 1 cm, or at least 3 cm, or a length at least sufficient to stop or absorb gamma-radiation.

The present invention provides for an inorganic scintillator described and/or having the properties described in Examples 1 or 2 or 3.

The present invention also provides for a composition comprising essentially of a mixture of compounds useful for producing the inorganic scintillator. When the Ln has a valence of 2+, the mixture comprises essentially of a solid $BaCO_3$, a solid $(NH_4)_2HPO_4$, and a solid $Ln_2O_3$; wherein Ln is a lanthanide with a valence of 2+; wherein the mixture has a stoichiometry of about (3-x) number of Ba atoms: y P atom: z O atoms: x number of Ln atoms; wherein x has a value having the range 0<x<3, and y is 2 and z is 8, or y is 4 and z is 13.

The compounds can be powdered crystals. The compounds are essentially pure. Such compounds are commercially available.

The present invention further provides for a method for producing the composition comprising an inorganic scintillator as described herein comprising: (a) providing a composition comprising essentially of a mixture of compounds useful for producing the inorganic scintillator as described herein, (b) heating the mixture so that the compounds start to react, and (c) cooling the mixture to room temperature such that the composition comprising an inorganic scintillator is formed.

The invention provides for a device comprising a composition comprising an inorganic scintillator or lanthanide-doped barium phosphorous oxide of the present invention and a photodetector. The device is useful for the detection of an ionizing radiation, such as gamma radiation. The device is useful for industrial, medical, protective and defensive purpose or in the oil and nuclear industry.

In some embodiments of the invention, the device is a gamma ray (or like radiation) detector which comprises a single crystal of lanthanide-doped barium phosphorous oxide. When assembled in a complete detector, the scintillator crystal is optically coupled, either directly or through a suitable light path, to the photosensitive surface of a photodetector for generation of an electrical signal in response to the emission of a light pulse by the scintillator. The inorganic scintillator of the invention possesses certain important characteristics, most notably high light output, very short decay time and high detection efficiency, that make it superior to prior scintillators as a gamma ray or like radiation detector, in particular for homeland security applications, such as nuclear material detection.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION OF THE INVENTION

Figure 1:
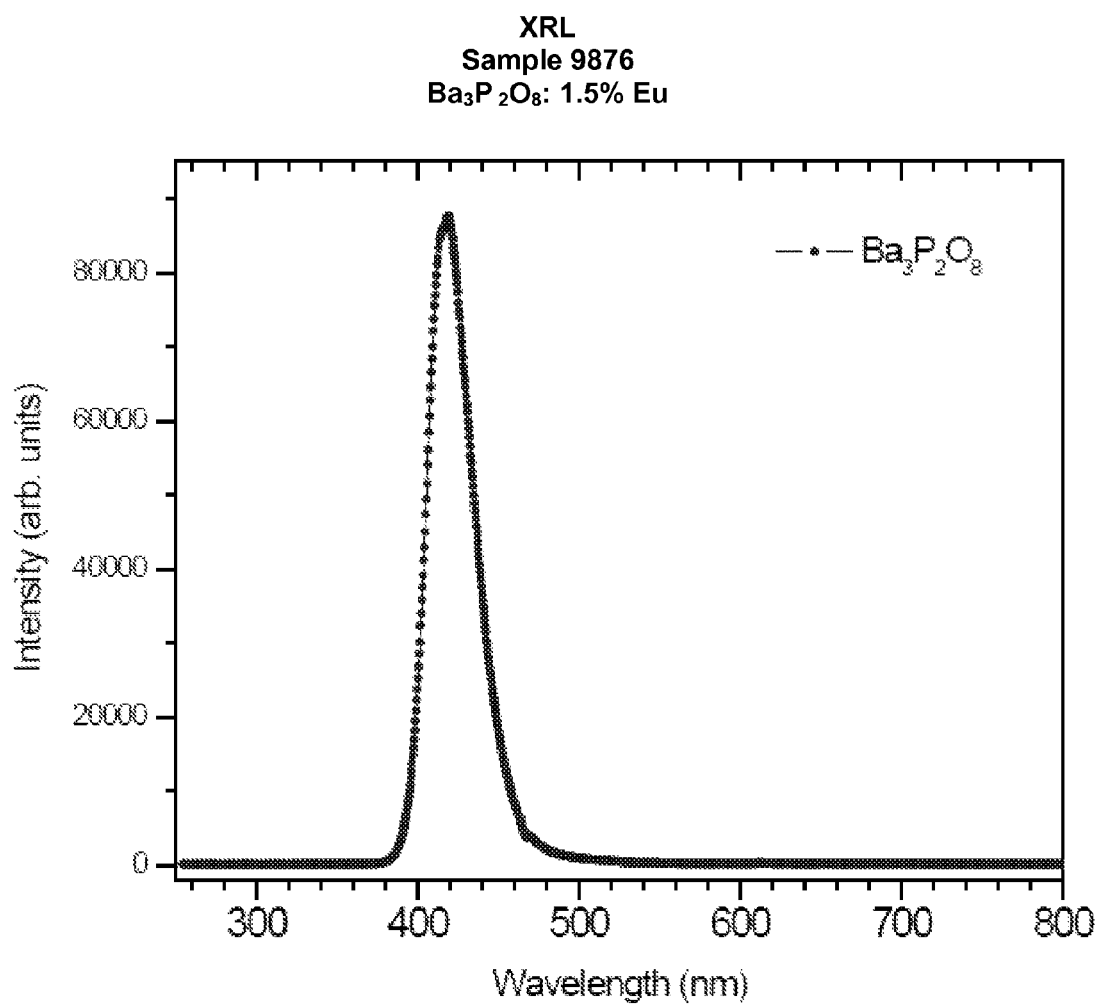
FIG. 1 shows the emission spectrum of a $Ba_3(PO_4)_2$: 1.5% Eu crystal under x-ray excitation.

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

As used in the specification and the asppended claims, the singular forms "a", "an", and "the" include plural references unless the context clearly dictates otherwise. Thus, for example, reference to a "crystal" includes a single crystal as well as a plurality of crystals.

The terms "optional" or "optionally" as used herein mean that the subsequently described feature or structure may or may not be present, or that the subsequently described event or circumstance may or may not occur, and that the description includes instances where a particular feature or structure is present and instances where the feature or structure is absent, or instances where the event or circumstance occurs and instances where it does not.

These and other objects, advantages, and features of the invention will become apparent to those persons skilled in the art upon reading the details of the invention as more fully described below.

The Inorganic Scintillators

The inorganic scintillator can be in a polycrystalline powder or a single crystal form. The crystal can be any size with an average volume of at least $0.001$ mm$^3$, at least 1 mm$^3$, at least 5 mm$^3$, at least 10 mm$^3$, at least 100 mm$^3$, at least 3 cm$^3$, at least 1 cm$^3$, or at least 10 cm$^3$. The crystal can be any size with at least one dimension of the crystal having a length of at least 100 μm, at least 1 mm, at least 2 mm, at least 5 mm, at least 1 cm, at least 3 cm, at least 5 cm, or at least 10 cm. In some embodiments of the invention, the crystal has at least one dimension having a length that is of sufficient length, or depth, to stop or absorb gamma-radiation in order to electronically detect the gamma-radiation.

The lanthanide atoms in the inorganic scintillator substitute for the barium atoms.

The inorganic scintillators of the present invention are useful as they are scintillators and they produce a useful bright and fast scintillation in response to irradiation by short-wavelength high energy light, such as x-ray or gamma rays. The crystals of the inorganic scintillator also have the added advantage of having the property of readily growing into crystals. Large size crystals can be grown by the following technique: Bridgman growth and related techniques, Czochralski growth and related techniques, the traveling heater method and related techniques.

In some embodiments of the invention, wherein Ln is a lanthanide with a valence of 2+, x has a value having the range $0.001 \leq x < 2$. In some embodiments of the invention, wherein Ln is a lanthanide with a valence of 2+, x has a value having the range $0.001 \leq x \leq 1$. In some embodiments of the invention, wherein Ln is a lanthanide with a valence of 2+, x has a value having the range $0.001 \leq x \leq 0.5$. In some embodiments of the invention, wherein Ln is a lanthanide with a valence of 2+, x has a value having the range $0.01 \leq x \leq 0.5$. In some embodiments of the invention, wherein Ln is a lanthanide with a valence of 2+, x has a value having the range $0.02 \leq x \leq 0.2$.

In some embodiments of the invention, the inorganic scintillator is a single crystal having at least one dimension of a length of at least 1 mm, at least 5 mm, at least 1 cm, or at least 3 cm, or a length at least sufficient to stop or absorb gamma-radiation.

The present invention provides for an inorganic scintillator described and/or having the properties described in Examples 1 or 2.

Characterization of the Inorganic Scintillators

The crystals of the invention can be characterized using a variety of methods. The crystals can be characterized regarding X-ray diffractometry, X-ray luminescence spectra, X-ray fluorescence for concentration of activators, and/or pulsed X-ray time response. X-ray diffractometry determines the composition of crystalline solids, such as crystalline phase identification. X-ray luminescence spectra determines the spectra components. Pulsed X-ray time response determines luminosity, decay times, and fractions. X-ray luminescence is used to determine the relative luminosity of a crystal. An X-ray excited emission spectra is obtained of a crystal by irradiating the crystal with an X-ray and collecting the emission light by a CCD detector.

In some embodiments of the invention, the luminosity of the inorganic scintillator is more than the luminosity of yttrium aluminium perovskite (YAP) and/or bismuth germanate (BGO). In further embodiments of the invention, the luminosity of the inorganic scintillators is more than double the luminosity of YAP and/or BGO.

In some embodiments of the invention, the inorganic scintillators, such as $Ba_3P_2O_8$: 1.5% Eu, have a luminescence output equal to or more than 27,000 photons/MeV, and a decay of essentially all of the luminescence light being emitted in a period equal to or less than 620 ns.

In some embodiments of the invention, the inorganic scintillators, such as $Ba_3P_4O_{13}$: 1.5% Eu, have a luminescence output equal to or more than 27,000 photons/MeV, and a decay of essentially all of the luminescence light being emitted in a period equal to or less than 830 ns.

Preparation of the Inorganic Scintillators

The inorganic scintillators of the invention can be prepared using a variety of methods. For example, the crystals useful for fabrication of luminescent screens can be prepared by a solid-state reaction aided, or optionally not aided, by a flux of compounds as described herein. In some embodiments, the single crystals are prepared by providing a composition comprising essentially of a mixture of compounds useful for producing the inorganic scintillator as described herein. The mixture is heated to a temperature of up to about 1125° C. using a simple programmable furnace to produce a reactive molten mixture. The reaction is maintained at temperature for the mixture to fully react and produce the desired melt. The resultant molten product of reaction is then cooled slowly at about 2 to 5° C./minute.

A particular method of preparing the inorganic scintillator of the invention is as follows: Bridgman growth and related techniques, Czochralski growth and related techniques, the traveling heater method and related techniques. These methods can be used to produce the inorganic scintillator as single crystals on a one-by-one basis.

The Bridgman growth technique is a directional solidification process. The technique involves using an ampoule containing a melt which moves through an axial temperature gradient in a furnace. Single crystals can be grown using either seeded or unseeded ampoules. The Bridgman growth technique is taught in Robertson J. M., 1986, Crystal growth of ceramics: Bridgman-Stockbarger method in Bever: 1986 "Encyclopedia of Materials Science and Engineering" Pergamon, Oxford pp. 963-964, which is incorporated by reference.

The Czochralski growth technique comprises a process of obtaining single-crystals in which a single crystal material is pulled out of the melt in which a single-crystal seed is immersed and then slowly withdrawn; desired optical properties and doping level is accomplished by adding dopants to the melt. The Czochralski growth technique is taught in J. Czochralski, "Ein neues Verfahren zur Messung der Kristallisationsgeschwindigkeit der Metalle" [A new method for the measurement of the crystallization rate of metals], Z. Phys. Chemie 92 (1918) 219-221, which is incorporated by reference. The method is well-know to those skilled in the art in producing a wide variety of compounds, including semiconductors and scintillator materials.

The traveling heater method is described in Triboulet Prog. Cryst. Gr. Char. Mater., 128, 85 (1994) and Funaki et al., Nucl. Instr. And Methods, A 436 (1999), which are incorporated in their entireties by reference.

A particular method of preparing inorganic scintillators of the invention is the ceramic method which comprises the following steps: The reactant mixture is placed in a container, such as a glove box, filled with one or more inert gas, such as nitrogen gas. The container can be under a very dry condition. The two or more powder reactants are ground together, such as with a mortar and pestle, for a sufficient period, such as about 10 minutes, to produce a reactant mixture. When the Ln oxide is added to the powder reactants for grinding, a suitable organic solvent or solution can be further added, and grinding can take place until the mixture appears dry. The reactant mixture is sintered under high temperature and pressure.

In some embodiment of the invention, the single crystals of the inorganic scintillator can be grown by melting and re-solidifying the pre-synthesized compounds in powder form, such as described herein, or directly from melting the mixtures of the compounds and lanthanide oxides used as activators. To grow best performing crystals the starting compounds might need to be purified further by zone refining.

Growing the single crystal involves loading the mixtures, such as described herein, in a quartz ampoule in a dry environment and sealing the ampoule using a high temperature torch, maintaining the dry environment at a reduced pressure, in the ampoule. The ampoule is then placed in a furnace. The growth of the crystal can be performed by a variation of the known vertical "Bridgman" technique. The compound is melted, let to homogenized at a temperature above the melting point and the compound is solidified in a directional manner in a temperature gradient. The ampoule is shaped to provide a nucleation site at the bottom (conical shape). The solidification front moves upward. Horizontal configurations and other growth techniques such as Czochralski (may need to pressurized the growth chamber) could be used.

The resulting crystals are then characterized by the methods described herein. The resulting crystals also have properties similar to those described herein.

Application of the Inorganic Scintillators

The present invention provides for a gamma ray or x-ray detector, comprising: a scintillator composed of a transparent single crystal of the inorganic scintillator of the present invention, and a photodetector optically coupled to the scintillator for producing an electrical signal in response to the emission of a light pulse by the scintillator.

The inorganic scintillators of this invention have many advantages over other known crystals. The inorganic scintillators produce a luminescence in response irradiation, such as irradiation by alpha-, beta-, or gamma-radiation, that is brighter and faster than known and commercially used scintillators. The scintillating crystals have a number of applications as detectors, such as in the detection of gamma-ray, which has use in national security, such as for detection of nuclear materials, and medical imaging applications.

The invention is useful for the detection of ionizing radiation. Applications include medical imaging, nuclear physics, nondestructive evaluation, treaty verification and safeguards, environmental monitoring, and geological exploration. This will be a major improvement, providing much finer resolution, higher maximum event rates, and clearer images.

Also, activated inorganic scintillator crystals of the present invention can be useful in positron emission tomography (PET).

The invention also relates to the use of the scintillating material above as a component of a detector for detecting radiation in particular by gamma rays and/or X-rays. Such a detector especially comprises a photodetector optically coupled to the scintillator in order to produce an electrical signal in response to the emission of a light pulse produced by the scintillator. The photodetector of the detector may in particular be a photomultiplier, photodiode, or CCD sensor.

A particular use of this type of detector relates to the measurement of gamma or x-ray radiation, such a system is also capable of detecting alpha and beta radiation and electrons. The invention also relates to the use of the above detector in nuclear medicine apparatuses, especially gamma cameras of the Anger type and positron emission tomography scanners (see, for example C. W. E. Van Eijk, "Inorganic Scintillator for Medical Imaging", International Seminar New types of Detectors, 15 19 May 1995—Archamp, France. Published in "Physica Medica", Vol. XII, supplement 1, June 96; hereby incorpoaretd by reference).

In another particular use, the invention relates to the use of the above detector in detection apparatuses for oil drilling, (see, for example "Applications of scintillation counting and analysis", in "Photomultiplier tube, principle and application", chapter 7, Philips; hereby incorporated by reference).

Figure 5:
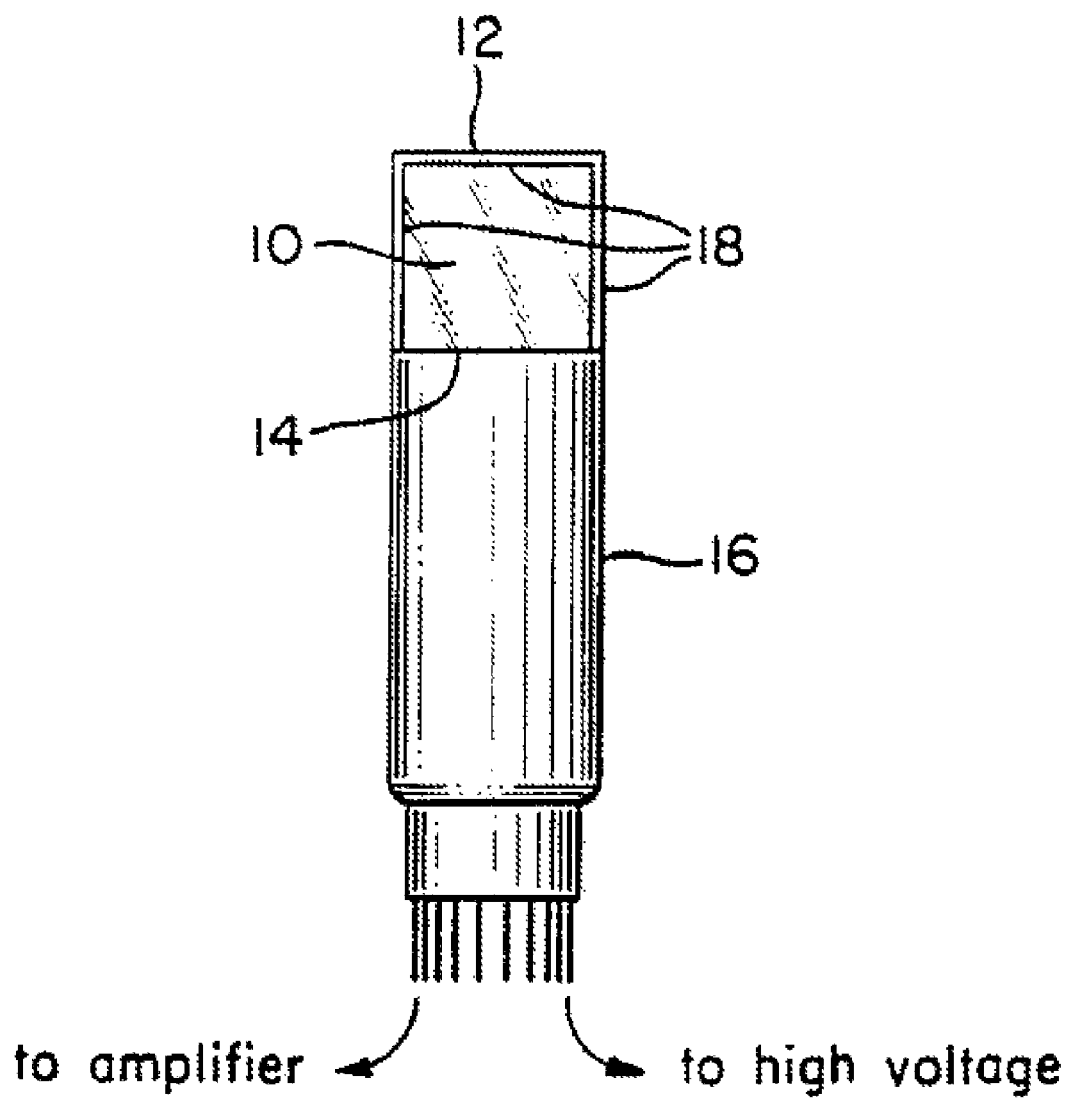
FIG. 5 is a diagrammatic view of one embodiment of a scintillation detector in accordance with the present invention.

One embodiment of the invention is shown in FIG. 5 which shows a gamma ray detector. The detector can be one as described in U.S. Pat. No. 4,958,080, hereby incorporated by reference. It will be understood, of course, that the utility of the novel single crystal inorganic scintillator of the invention is not limited to the detection of gamma radiation but that it has general application to the detection of other types of like radiation, e.g. X-rays, cosmic rays, and energetic particles.

In FIG. 5, a single crystal inorganic scintillator 10 is shown encased within the housing 12 of a gamma ray detector. One face 14 of the scintillator is placed in optical contact with the photosensitive surface of a photomultiplier tube 16. Alternatively, the light pulses could be coupled to the photomultiplier via light guides or fibers, lenses, mirrors, or the like. The photomultiplier can be replaced by any suitable photodetector such as a photodiode, microchannel plate, etc. In order to direct as much of each light flash to the photomultiplier as possible, the other faces 18 of the inorganic scintillator are preferably surrounded or covered with a reflective material, e.g. Teflon tape, magnesium oxide powder, aluminum foil, or titanium dioxide paint. Light pulses emitted by the crystal inorganic scintillator upon the incidence of radiation are intercepted, either directly or upon reflection from the surfaces 18, by the photomultiplier, which generates electrical pulses or signals in response to the light pulses. These electrical output pulses are typically first amplified and then subsequently processed as desired, e.g. in a pulse height amplifier, to obtain the parameters of interest regarding the detected radiation. The photomultiplier is also connected to a high voltage power supply, as indicated in FIG. 5. Other than the inorganic scintillator, all of the components and materials referred to in connection with FIG. 5 are conventional, and thus need not be described in detail.

It is to be understood that, while the invention has been described in conjunction with the preferred specific embodiments thereof, the foregoing description is intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties.

The invention having been described, the following examples are offered to illustrate the subject invention by way of illustration, not by way of limitation.

EXAMPLE 1

Synthesis and Characterization of $Ba_3P_2O_8$: 1.5% Eu

Powder samples are prepared by solid state reactions at high temperature. The starting materials are $BaCO_3$ (Alfa Aesar, Ward Hill, Mass.), $(NH_4)_2HPO_4$ (Mallinckrodt, Hazelwood, Mo.) and $Eu_2O_3$ (Alfa Aesar, Ward Hill, Mass.). Stoichiometric amounts of the starting reagents are thoroughly mixed and ground together using mortar pestle. The mixture is placed in an alumina crucible that is placed in a tube furnaces equipped for flowing various gases over the samples. Initially, the mixture is heated at 500° C. for 5 h, under 3% $H_2$ in $N_2$ or 3% $H_2$ in Ar atmosphere, reground and reheated at 1125° C. for 5 h, under 3% $H_2$ in $N_2$ or 3% $H_2$ in Ar atmosphere, then reground and reheated again at 1125° C. for 5 h, under 3% $H_2$ in $N_2$ or 3% $H_2$ in Ar atmosphere. All powder samples are white. All powder samples are checked by means of a X-ray powder diffraction technique for phase identification and crystallinity. Table 1 provides synthesis examples.

TABLE 1

| Sample ID | $BaCO_3$ (mg) | $(NH_4)_2HPO_4$ (mg) | $Eu_2O_3$ (mg) | Compound | Synthesis procedure |
|---|---|---|---|---|---|
| 9787 | 1351 | 612 | 37 | $Ba_3P_2O_8$ | P1: 1125/5 h/N2—H2, regrind<br>P2: 1125 C./5 h/N2—H2 |
| 9795 | 549 | 246 | 5 | $Ba_3P_2O_8$ | P1: 1150 C./5 h/Ar—H2/ |
| 9804 | 549 | 246 | 5 | $Ba_3P_2O_8$ | P1: 1125 C./5 h/Ar—H2/ |
| 9809 | 549 | 246 | 5 | $Ba_3P_2O_8$ | P1: 1125 C./10 h/Ar—H2/regrind<br>P2: 1125 C./5 h/Ar—H2/ |
| 9810 | 4060 | 1830 | 110 | $Ba_3P_2O_8$ | P1: 500 C. and regrind<br>P2: 1125 C./5 h/Ar—H2/regrind<br>P3: 1125/5 h/Ar—H2/ |
| 9874 | 4060 | 1830 | 110 | $Ba_3P_2O_8$ | P1: 500 C./5 h and grind<br>P2: 1125 C./5 h/N2—H2/Al crucibles/grind<br>P3: 1125/5 h/N2—H2/ |
| 9876 | 4060 | 1830 | 110 | $Ba_3P_2O_8$ | P1: 500 C. and grind<br>P2: 1125 C./5 h/Ar—H2/Al crucibles/grind<br>P3: 1125/5 h/Ar—H2/ |

Figure 2:
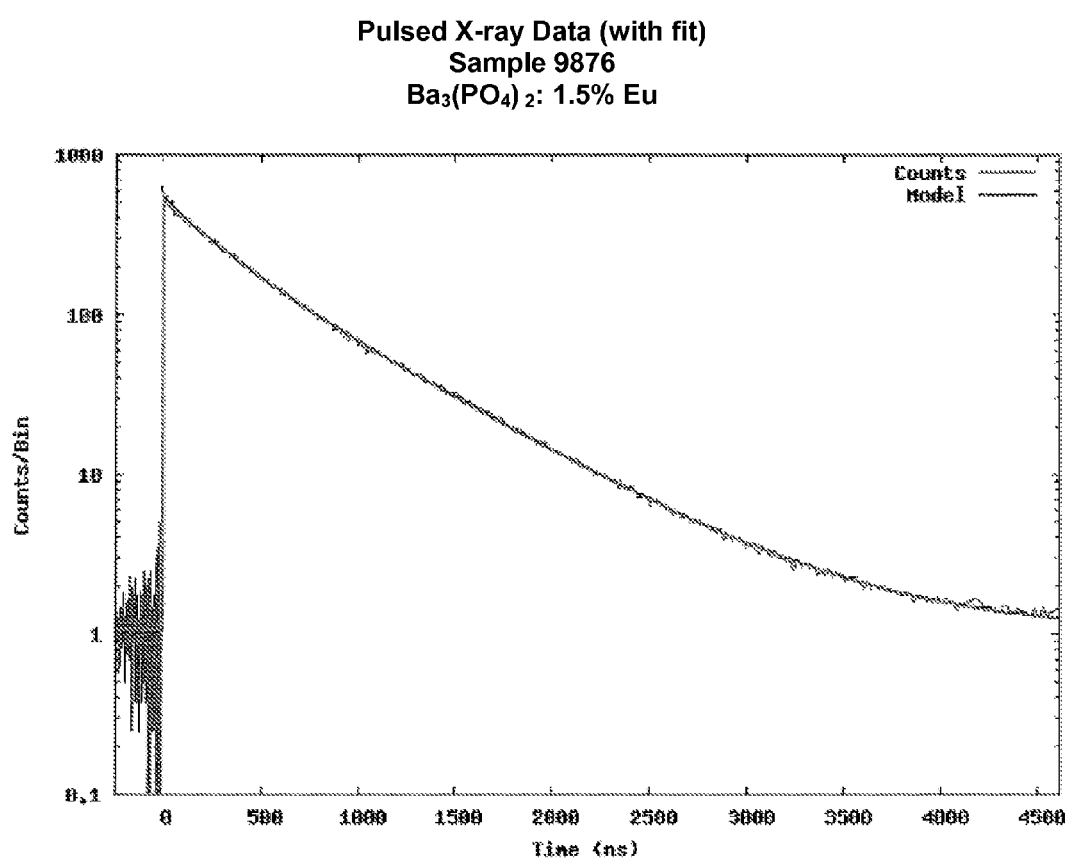
FIG. 2 shows the pulsed x-ray measurement of $Ba_3(PO_4)_2$: 1.5% Eu showing a decay time for 90% of the emitted light of less than 2.6 µs.
Figure 3:
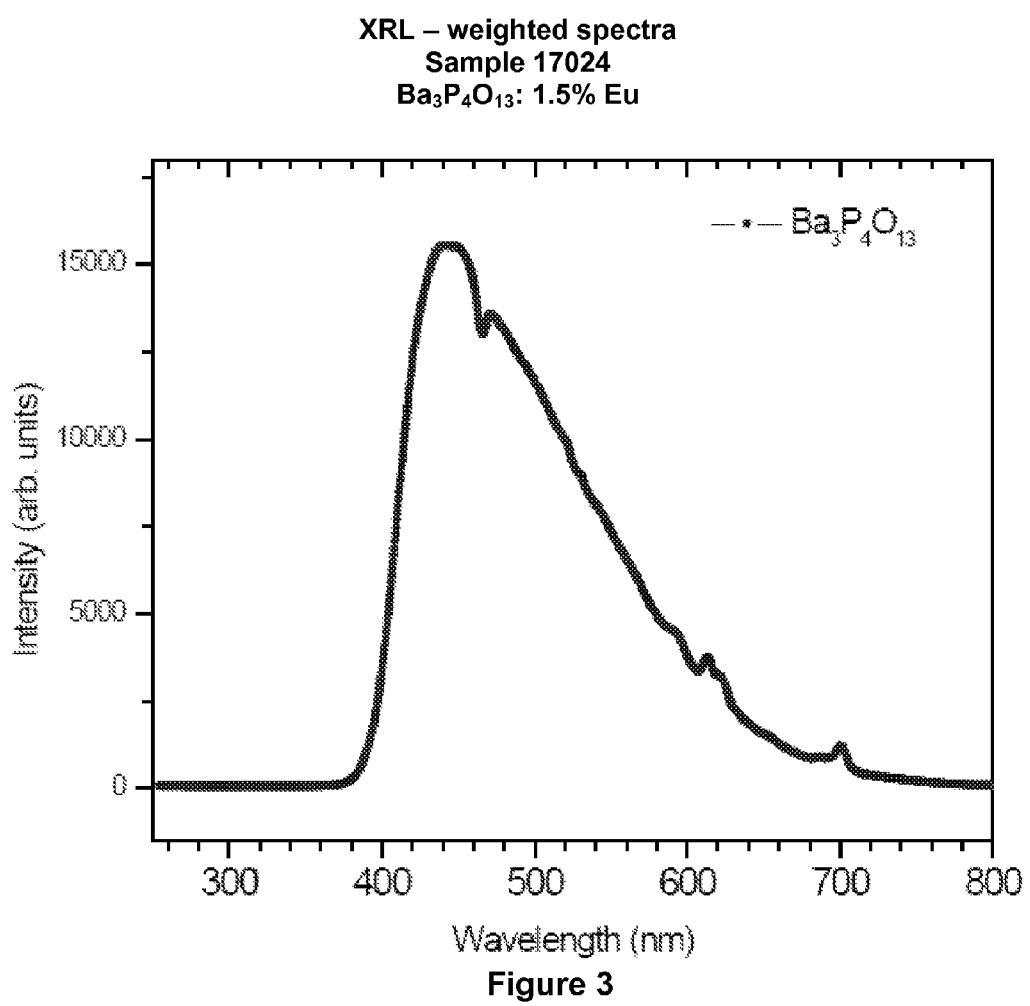
FIG. 3 shows the weighted emission spectrum of a $Ba_3P_4O_{13}$: 1.5% Eu crystal under x-ray excitation.
Figure 4:
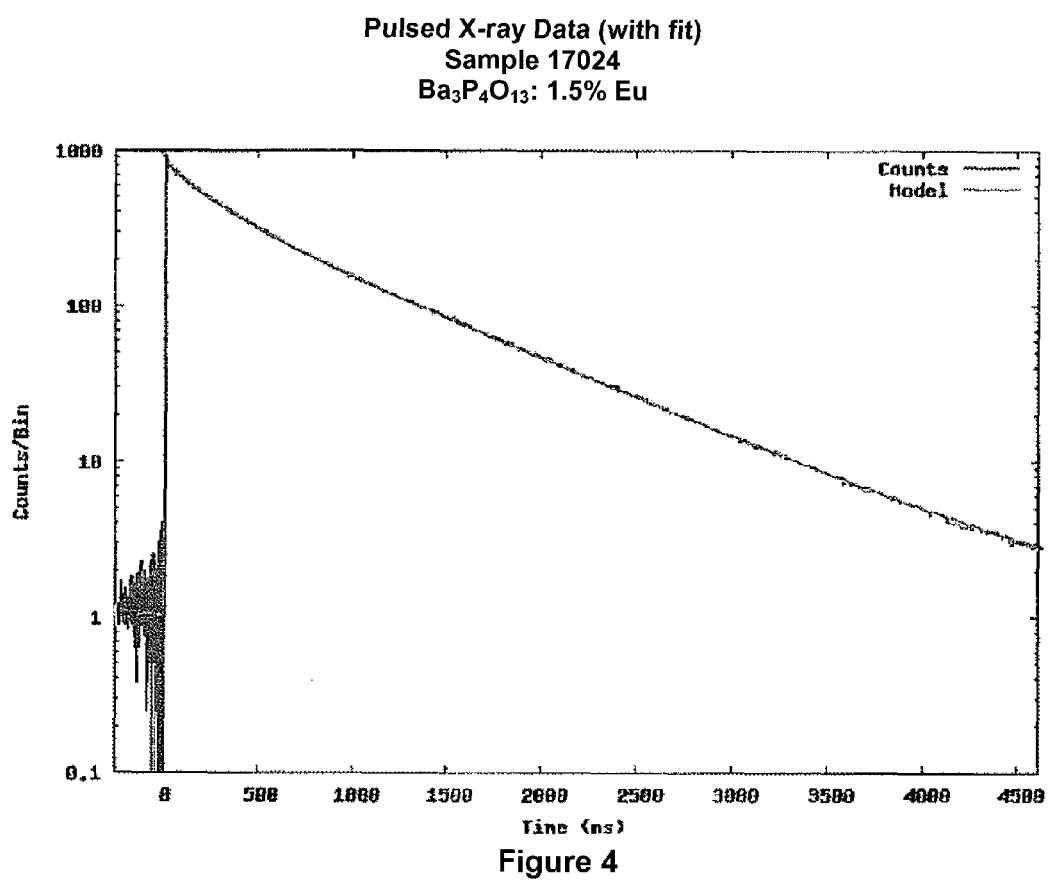
FIG. 4 shows the pulsed x-ray measurement of $Ba_3P_4O_{13}$: 1.5% Eu showing a decay time for 90% of the emitted light of less than 3.5 µs.

The samples are evaluated for scintillation properties. FIGS. 1 and 2 show the x-ray luminescence and decay curve, respectively, for one of the samples.

These inorganic scintillators are useful for national security purposes, such as detecting nuclear material.

EXAMPLE 2

Synthesis and Characterization of $Ba_3P_4O_{13}$: 1.5% Eu

Powder samples are prepared by solid state reactions at high temperature. The starting materials are $BaCO_3$ (Alfa Aesar, Ward Hill, Mass.), $(NH_4)_2HPO_4$ (Mallinckrodt, Hazelwood, Mo.), and $Eu_2O_3$ (Alfa Aesar, Ward Hill, Mass.). Stoichiometric amounts of the starting reagents are thoroughly mixed and ground together using mortar pestle. The mixture is placed in an alumina crucible that is placed in a tube furnaces equipped for flowing various gases over the samples. In a typical synthesis, the mixture is heated at 800° C. for 5 h, under 3% $H_2$ in Ar atmosphere, and then heated at 1125° C. for 5 h, under 3% $H_2$ in $N_2$ or 3% $H_2$ in Ar atmosphere, then reground and reheated again at 1125° C. for 5 h, under 3% $H_2$ in $N_2$ or 3% $H_2$ in Ar atmosphere. All powder samples are white. All powder samples are checked by means of a X-ray powder diffraction technique for phase identification and crystallinity. Table 2 provides synthesis examples.

TABLE 2

| Sample ID | $BaCO_3$ (mg) | $(NH_4)_2HPO_4$ (mg) | $Eu_2O_3$ (mg) | Compound | % Eu* | Synthesis procedure |
|---|---|---|---|---|---|---|
| 17012 | 417 | 376 | 8 | $Ba_3P_4O_{13}$ | 1.0 | P1: 800 C./5 h/Ar—H2 |
| 17022 | 420 | 376 | 4 | $Ba_3P_4O_{13}$ | 0.5 | P1: 800 C./5 h/ and 500 C./15 h/Ar—H2/ |
| 17024 | 414 | 375 | 11 | $Ba_3P_4O_{13}$ | 1.5 | P1: 1125 C./5 h/ and 500 C./15 h/Ar—H2/ |
| 17025 | 411 | 374 | 15 | $Ba_3P_4O_{13}$ | 2.0 | P: 1800 C./5 h and 500/15 h/Ar—H2/ |
| 17026 | 408 | 376 | 19 | $Ba_3P_4O_{13}$ | 2.5 | P: 1800 C./5 h and 500/15 h/Ar—H2/ |
| 17015 | 382 | 367 | 51 | $Ba_3P_4O_{13}$ | 7.0 | P1: 800 C./5 h/Ar—H2 |
| 17016 | 365 | 362 | 72 | $Ba_3P_4O_{13}$ | 10 | P1: 800 C./5 h/Ar—H2 |

*With respect to barium.

The samples are evaluated for scintillation properties. FIGS. 1 and 2 show the x-ray luminescence and decay curve, respectively, for one of the samples.

These inorganic scintillator crystals are useful for national security purposes, such as detecting nuclear material.

EXAMPLE 3

Characterization of $Ba_3P_2O_8$ Based the Varying Amount of Eu Dopant

Figure 6:
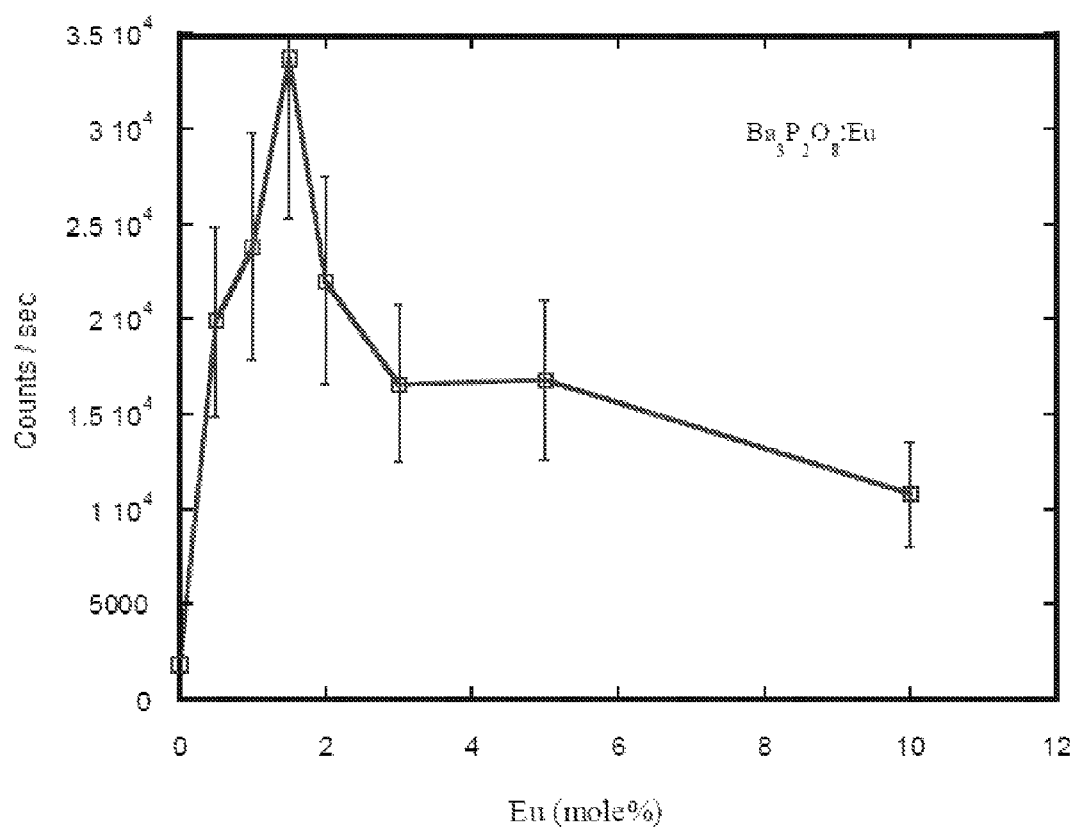
FIG. 6 shows the Europium concentration dependence of the scintillation light yield of $Eu^{2+}$ doped $Ba_3(PO_4)_2$.

Samples of $Ba_3(PO_4)_2$ with differing concentrations of Eu (up to 10 mole %) are synthesized, and the scintillation light yield of each is determined (see FIG. 6).

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. An inorganic scintillator having the formula:

$$Ba_{3-x}(PO_4)_2:Ln_x \quad (II);$$

wherein Ln is a lanthanide with a valence of 2+, and x has a value having the range 0<x<3.

2. The inorganic scintillator of claim 1, wherein the Ln is Eu.

3. The inorganic scintillator of claim 1, wherein x has a value having the range $0.001 \leq x < 2$.

4. The inorganic scintillator of claim 3, wherein x has a value having the range $0.001 \leq x \leq 1$.

5. The inorganic scintillator of claim 4, wherein x has a value having the range $0.001 \leq x \leq 0.5$.

6. The inorganic scintillator of claim 5, wherein x has a value having the range $0.01 \leq x \leq 0.5$.

7. The inorganic scintillator of claim 6, wherein x has a value having the range $0.02 \leq x \leq 0.2$.

8. An inorganic scintillator having the formula:

$$Ba_{3-x}P_4O_{13}:Ln_x \quad (III);$$

wherein Ln is a lanthanide with a valence of 2+, and x has a value having the range $0.001 \leq x < 2$.

9. The inorganic scintillator of claim 8, wherein the Ln is Eu.

10. A gamma ray or x-ray detector, comprising: (a) a scintillator composed of a transparent single crystal of an inorganic scintillator having the formula:

$$Ba_{3-x}P_yO_z:Ln_x \quad (I);$$

wherein Ln is a lanthanide with a valence of 2+; x has a value having the range 0<x<3; and, y is 2 and z is 8, or y is 4 and z is 13; and (b) a photodetector optically coupled to the scintillator for producing an electrical signal in response to the emission of a light pulse by the scintillator.

11. The detector of claim 10, wherein the inorganic scintillator has the formula:

$$Ba_{3-x}(PO_4)_2:Ln_x \quad (II);$$

wherein Ln is a lanthanide with a valence of 2+, and x has a value having the range 0<x<3.

12. The detector of claim 11, wherein the Ln is Eu.

13. The detector of claim 10, wherein the inorganic scintillator has the formula:

$$Ba_{3-x}P_4O_{13}:Ln_x \quad (III);$$

wherein Ln is a lanthanide with a valence of 2+, and x has a value having the range 0<x<3.

14. The detector of claim 13, wherein the Ln is Eu.

15. The detector of claim 10, wherein x has a value having the range $0.001 \leq x < 2$.

16. The detector of claim 15, wherein x has a value having the range $0.001 \leq x \leq 1$.

17. The detector of claim 16, wherein x has a value having the range $0.001 \leq x \leq 0.5$.

18. The detector of claim 17, wherein x has a value having the range $0.01 \leq x \leq 0.5$.

19. The detector of claim 18, wherein x has a value having the range $0.02 \leq x \leq 0.2$.

* * * * *